United States Patent
Miura et al.

[11] Patent Number: 6,052,173
[45] Date of Patent: Apr. 18, 2000

[54] DEVICE FOR EXPOSING THE PERIPHERAL AREA OF A WAFER

[75] Inventors: Shinetsu Miura, Kawasaki; Yoshiki Mimura, Yokohama, both of Japan

[73] Assignee: Ushiodenki Kabushiki Kaisha, Tokyo, Japan

[21] Appl. No.: 09/200,477

[22] Filed: Nov. 27, 1998

[30] Foreign Application Priority Data

Nov. 26, 1997 [JP] Japan .................................... 9-324440
Feb. 9, 1998 [JP] Japan ................................... 10-027145

[51] Int. Cl.$^7$ ........................... G03B 27/42; G03B 27/54
[52] U.S. Cl. ................................ 355/53; 355/67
[58] Field of Search ................................. 355/30, 50, 53, 355/67, 77; 250/548; 430/22, 30; 356/400, 401

[56] References Cited

U.S. PATENT DOCUMENTS

| | | | |
|---|---|---|---|
| 4,899,195 | 2/1990 | Gotoh ........................................ | 355/77 |
| 5,168,021 | 12/1992 | Arai et al. .................................. | 430/22 |
| 5,204,224 | 4/1993 | Suzuki ...................................... | 430/315 |
| 5,229,811 | 7/1993 | Hattori et al. ............................. | 355/50 |
| 5,420,663 | 5/1995 | Nakajima et al. ......................... | 355/50 |
| 5,811,211 | 9/1998 | Tanaka et al. ............................. | 430/30 |
| 5,880,816 | 3/1999 | Mimura et al. ............................ | 355/53 |
| 5,929,976 | 7/1999 | Shibuya et al. ............................ | 355/53 |
| 5,982,474 | 11/1999 | Akiyama et al. ......................... | 355/53 |

FOREIGN PATENT DOCUMENTS

| | | |
|---|---|---|
| 0 767 409 | 4/1997 | European Pat. Off. . |
| 4-291938 | 10/1992 | Japan . |
| 8-102439 | 4/1996 | Japan . |

*Primary Examiner*—Alan A. Mathews
*Assistant Examiner*—Hung Henry Nguyen
*Attorney, Agent, or Firm*—Nixon Peabody LLP; David S. Safran

[57] ABSTRACT

A device for exposure of the peripheral area of a wafer with a small shape and at low costs in which, using a device for stepped exposure of the peripheral area of a wafer, the peripheral area of a wafer can be exposed in a ring shape. A wafer to which resist has been applied is placed on a rotary support and rotated once. The seated state of the wafer and a singular orienting shape such as an Ori-Fla or the like are determined. Based on this information, the wafer is positioned in a given position. Then, the rotary support is moved by means of an X-Y support and exposure is performed. If the coordinates of the center of rotation ($X\Theta, Y\Theta$) are taken accurately a ring shape is approached in practice (if, for example, $\Theta=0.1°$ and for a polygon with 3600 corners a circle is approached), there is no problem. Two exposure devices are not necessary, specifically one device for stepped exposure of the peripheral area of a wafer and one device for ring-shaped exposure of the peripheral area. The peripheral area of the wafer can be exposed both in a step-shape and also ring-shape with a single device. Therefore the area occupied by the device can be reduced, as can equipment costs. In the case of stepped exposure of one part of the peripheral area of the wafer and ring-shaped exposure of the other part thereof, the wafer need not be transported. Furthermore, the peripheral edge of the wafer need be determined only once. Therefore throughput can be increased. Using a device for stepped exposure of the peripheral area of the wafer, the peripheral area of the wafer can be exposed in a ring shape without using a memory with a high capacity. The peripheral area of the wafer can be exposed in a ring shape without bringing the wafer center and the center of the rotary support into agreement with one another. Therefore a centering device is unnecessary. The centering process is eliminated. Thus both the device and actuation can be simplified.

3 Claims, 12 Drawing Sheets

Oc: wafer center
Or: center of rotation of the rotary support

Oc: wafer center
Or: center of rotation of the rotary support

Cross section
of optical fibers LF1

a device for exposing the peripheral
DEVICE FOR EXPOSING THE PERIPHERAL AREA OF A WAFER

BACKGROUND OF THE INVENTION

1. Field of the Invention

The invention relates to a device for exposing the peripheral area of a wafer which is used to remove unnecessary resist on the wafer in the development process. The invention relates especially to a device for exposing the peripheral area of a wafer in which the peripheral area of a wafer can be exposed in a step shape and ring shape.

2. Description of Related Art

In the production of a semiconductor device, such as an IC, LSI or the like, photoresist, hereinafter called resist, is applied to the surface of a semiconductor wafer (hereinafter called a "wafer"), such as a silicon wafer or the like. In this way, a circuit pattern is formed.

The peripheral area of a wafer, however, is rarely used as an area in which the pattern is formed. In the case in which the resist is a positive resist, therefore, the peripheral area is not exposed, and as a result, the resist remains even after development in the peripheral area. This resist which has remained in the peripheral area causes impurities in peripheral devices and on the wafer surface, and thus, a reduction of yield due to loosening or the like during transport and holding of the wafer.

To remove the unnecessary resist in the peripheral area of a wafer in the development process, a process of exposure of the peripheral area of the wafer is undertaken in which, regardless of the process of exposure in the area in which the pattern is formed, the unnecessary resist is removed in the peripheral area.

To expose the peripheral area of a wafer usually the processes described below were carried out:

(1) The peripheral area of a wafer is irradiated with exposure light as the outlet end from which the exposure light emerges or the wafer is moved parallel to the wafer surface in orthogonally intersecting directions. The peripheral area of a wafer, as is shown in FIG. 14(a), is exposed in a step-shaped (hereinafter, this exposure process is called "stepped exposure"). (2) The peripheral area of a wafer is irradiated with exposure light as the wafer to which the resist has been applied is turned. The overall periphery or part of the periphery of the wafer is exposed in a ring-shape, as is illustrated in FIGS. 14(b) & (c) (hereinafter, this exposure process is called "ring-shaped exposure").

The stepped exposure described above in (1) is often used for exposure of the peripheral area when a circuit pattern is exposed in steps using a reduction projection exposure process of the stepper type on the wafer. In this stepwise exposure, several circuit patterns are formed on the wafer, each of which corresponds to a chip. The peripheral area of the region to be exposed in which the circuit pattern is formed is therefore step-shaped. This shape changes differently according to the exposure pattern.

In the peripheral area of the wafer, therefore, a stepped, unexposed area is formed. Therefore, the region with the unnecessary resist becomes stepped. This unnecessary resist causes a drop in yield due to loosening or the like, as was described above. The peripheral area of a wafer is therefore exposed by the process described above in (1) in steps so that creation of an area on the wafer which is not exposed is prevented.

Recently, there has been more and more often a demand for exposure of the peripheral area of a wafer in which, with simultaneous use of the stepped exposure and ring-shaped exposure, part of the peripheral area of the wafer is exposed in a step shape and the other part thereof is exposed in a ring shape, as is illustrated in FIG. 14(d).

To meet this demand, conventionally, an exposure device as described, for example, in Japanese patent disclosure document HEI 4-291938 for stepped exposure of the peripheral area of a wafer and a exposure device as described, for example, in Japanese patent disclosure document HEI 2-1114 (U.S. Pat. No. 4,899,195) for ring-shaped exposure of the peripheral area of a wafer were used, i.e. two exposure processes. Here, using two processes in which, using one of the devices some of the peripheral area of a wafer is exposed, for example, in a step shape, then the wafer is transported to the other device and the remainder of the peripheral area of the wafer is exposed in a ring shape, exposure of the entire peripheral area was produced.

However, the above described prior art has the following defects:

(1) It is necessary to have two exposure devices, i.e., one exposure device for stepped exposure of the peripheral area of a wafer and one exposure device for ring-shaped exposure of the peripheral area of a wafer. Therefore, the floor space occupied by the exposure devices in a clean room becomes larger.

(2) It is necessary, after placing the wafer on one of the exposure devices, to determine the seated state of the wafer and to position it, and after exposure, to transport the wafer to the other exposure device. Furthermore, it is necessary, afterwards, again to determine the seated state of the wafer and to position and expose it. There are, therefore, more working processes.

(3) To carry out the above described exposure in the same station, it can be imagined that using one exposure device for stepped exposure of the peripheral area of a wafer, the peripheral area of the wafer is exposed in a ring shape. In the stepped exposure in which exposure is performed along the outside edge of the circuit pattern, however, there is a requirement for exposure accuracy with high image resolution. Therefore, a large, heavy projection lens with high resolution is used. As a result, the exposure light exit end can, in principle, not move. Ring-shaped exposure using the conventional "copying method" in which the peripheral edge of a wafer is determined, and at the same time, the exposure light exit end is moved, therefore, can not be done.

On the other hand, in stepped exposure of the peripheral area of a wafer, if the width of the steps is reduced and the number of steps is increased, the area to be exposed can be made roughly ring-shaped. In this case, however, it is necessary to input a large amount of coordinate data. Data input is tedious. Furthermore, as a result of the enormously large amount of data, a storage device with a large capacity is required.

In addition, it can be considered a disadvantage that a long treatment time is needed if a MPU which enables fast treatment is not used.

If the resolution capacity of the above described data is reduced, the above described defects tend to be eliminated. Instead, however, microscopically small steps form on the border of the area exposed in a ring-shape, and proceeding from this border, area loosening of the resist occurs.

To eliminate the above described defects, one of the present applicants, together with others, has already proposed a device for exposure of the peripheral area of a wafer (Japanese patent disclosure document HEI 8-161443 and commonly assigned U.S. patent application Ser. No. 08/794, 829). Here, in a first station, there is an irradiation part for step-shaped exposure, in a second station there is an irradiation part for ring-shaped exposure, the peripheral area of the wafer seated on the rotary support in the first station is exposed in a step shape, the rotary support is moved to the second station and the peripheral area of the wafer is exposed in a ring shape.

In the above described device, however, there was the disadvantage that a large device is needed because there is an irradiation part for stepped exposure and there is an irradiation part for ring-shaped exposure. In the first station, step-shaped exposure is performed, then the rotary support is moved to the second station and ring-shaped exposure is performed. Conventional ring-shaped exposure of the peripheral area is performed only after the wafer has been centered. Therefore, a centering device necessarily had to be used.

SUMMARY OF THE INVENTION

The invention was devised to eliminate the above described defects in the prior art. Therefore, a primary object of the present invention is to devise a device for exposure of the peripheral area of a wafer with a small shape and low costs, in which a device for stepped exposure of the peripheral area of a wafer can be used for exposing the peripheral area of the wafer in a ring shape, and in which neither a device to bring the wafer center into agreement with the center of rotation of the rotary support on which the wafer is located, nor a high capacity storage, are necessary.

This object is achieved using a device for stepped exposure of the peripheral area of the wafer, by means of a control based upon relationships described below and with which the peripheral area of the wafer can be exposed in a ring shape without moving the exposure light irradiation part and without bringing the wafer center and the center of the rotary support into agreement. Therefore, the need for an arrangement of a centering device for this purpose and a centering process can be eliminated and actuation of the device can be simplified.

In the following detailed description, the invention is explained using several embodiments shown in the drawings:

DETAILED DESCRIPTION OF THE INVENTION

Figure 1:
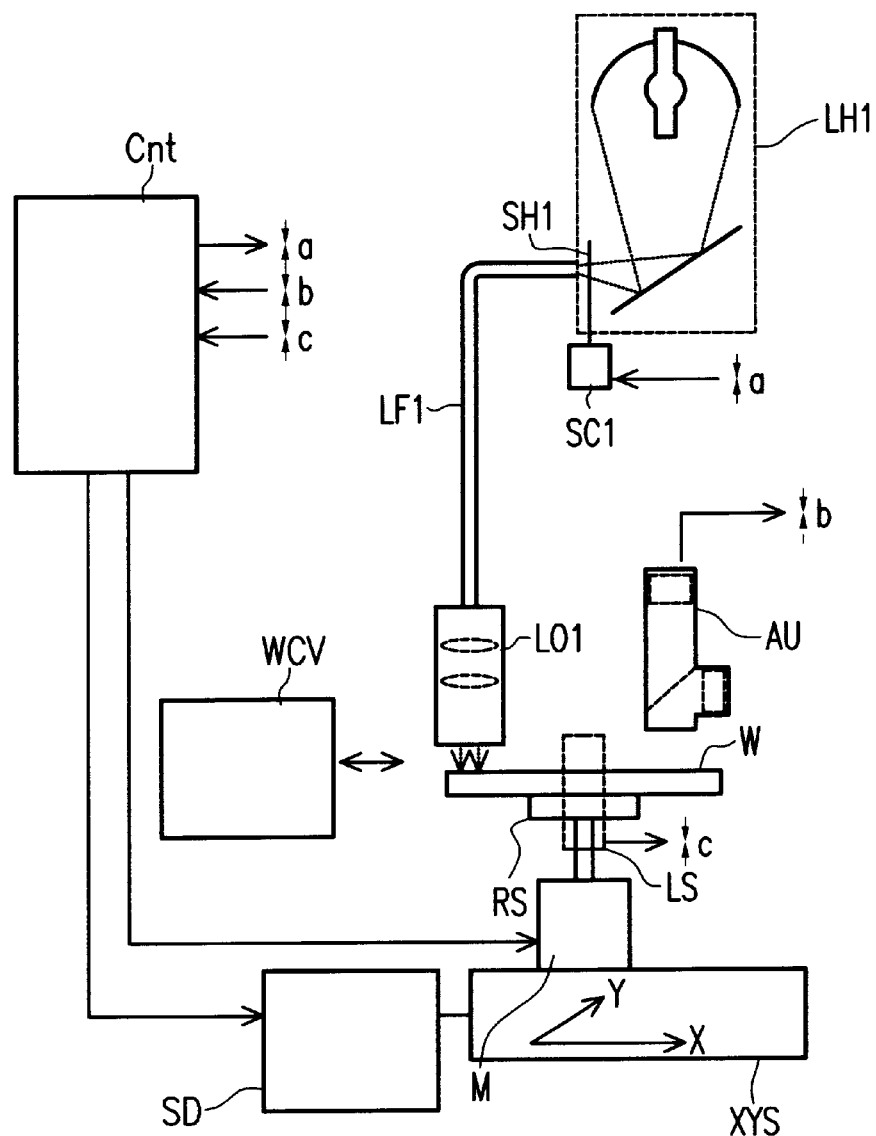
FIG. 1 shows a schematic of the arrangement of one embodiment of a device in accordance with the invention for exposure of the peripheral area of a wafer.

FIG. 1 is a schematic of the arrangement of one embodiment of the device in accordance with the present invention for exposing the peripheral area of a wafer. In FIG. 1, reference letters RS indicate a rotary support on which a wafer W is placed and held by means of a vacuum chuck or the like, and which is transported by a wafer transport system WCV. Here, no centering of the wafer center with respect to the center of the rotary support RS is performed.

Figure 2:
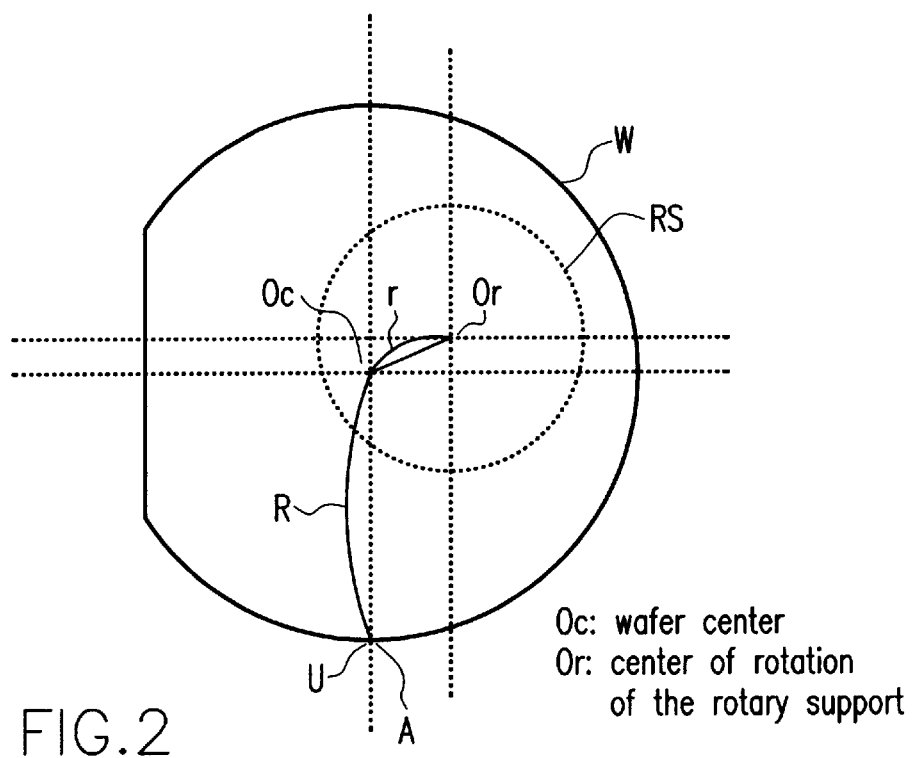
FIG. 2 is a schematic diagram of ring-shaped exposure of the peripheral area of the wafer (in the start position for exposure)

For ring-shaped exposure of the peripheral area of wafer W using a device for stepped exposure, by moving the wafer in two orthogonally intersecting directions (hereinafter called the "X-Y directions"), the rotary support RS is placed on an X-Y support XYS which moves the wafer W in the X-Y direction, and the X-Y support XYS and the rotary support RS are controlled in the manner described below:

It is assumed that the wafer W and the rotary support RS are located, for example, in the positional relationship shown in FIG. 2, Oc is the center of the wafer W, r is the distance between the center of rotation Or of the rotary support RS and the wafer center Oc, and R is the distance between the exposure light U (the location at which the light emerging from the exposure irradiation part is emitted) and the wafer center Oc.

The rotary support RS is located on the X-Y support and can be moved in two orthogonally intersecting directions. The location of the rotary support RS at which the wafer W is attached can be turned around the center of rotation Or.

A is the location of the wafer W at which exposure is started, from which the X-Y support XYS is subjected to drive control such that the exposure light U circles once relative to the periphery of the wafer W, while the rotary support RS turns once around the center of rotation Or. In this way, the position of the wafer W is shifted.

For this reason, the position of the wafer W is moved by the X-Y support such that the distance R between the wafer center Oc and the exposure light U is always constant while the rotary support RS is turned around the center of rotation Or by Θ degrees. This means that the X-Y support XYS is subjected to drive control such that, during rotation of the rotary support RS, the position of the wafer center Oc does not change.

Figure 3:
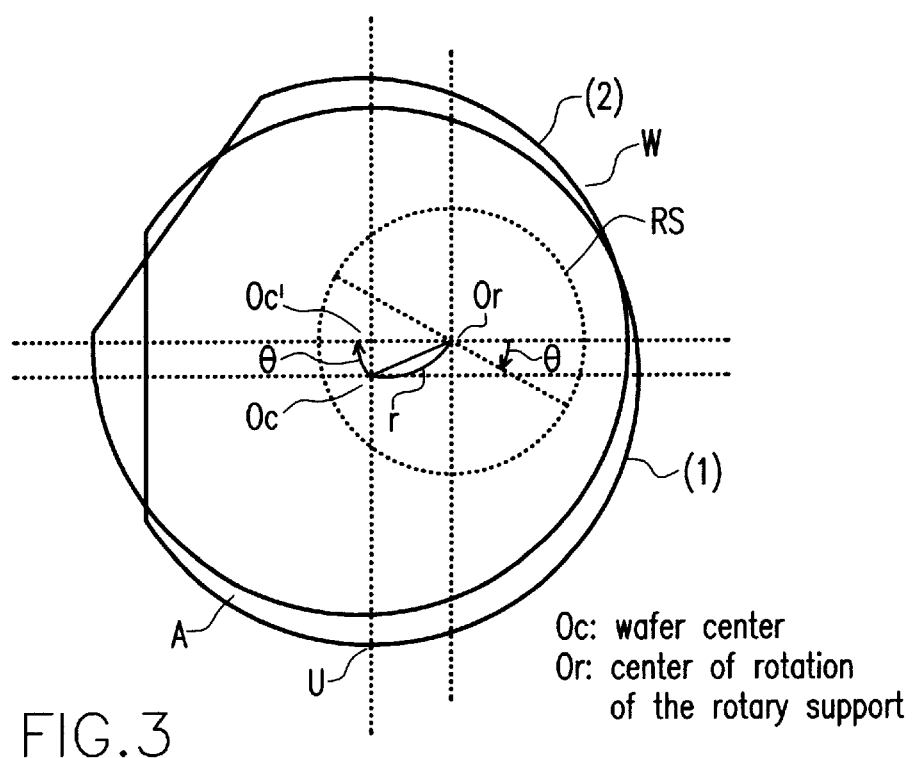
FIG. 3 is a view similar to that of FIG. 2 but showing exposure of the peripheral area of the wafer when the rotary support is turned by Θ degrees.

FIG. 3 is a schematic of the state in which, proceeding from the state shown in FIG. 2, the rotary support RS has been moved around the center of rotation Or clockwise by Θ degrees, the wafer W moving from position (1) to position (2), so that the wafer center Oc, when exposure starts, executes a clockwise rotary motion by Θ degrees in a circular path of radius R around the center of rotation Or of the rotary support RS and reaches the position Oc' (the angle which is included by the segment Oc-Or and the segment Oc'-Or is Θ).

Figure 4:
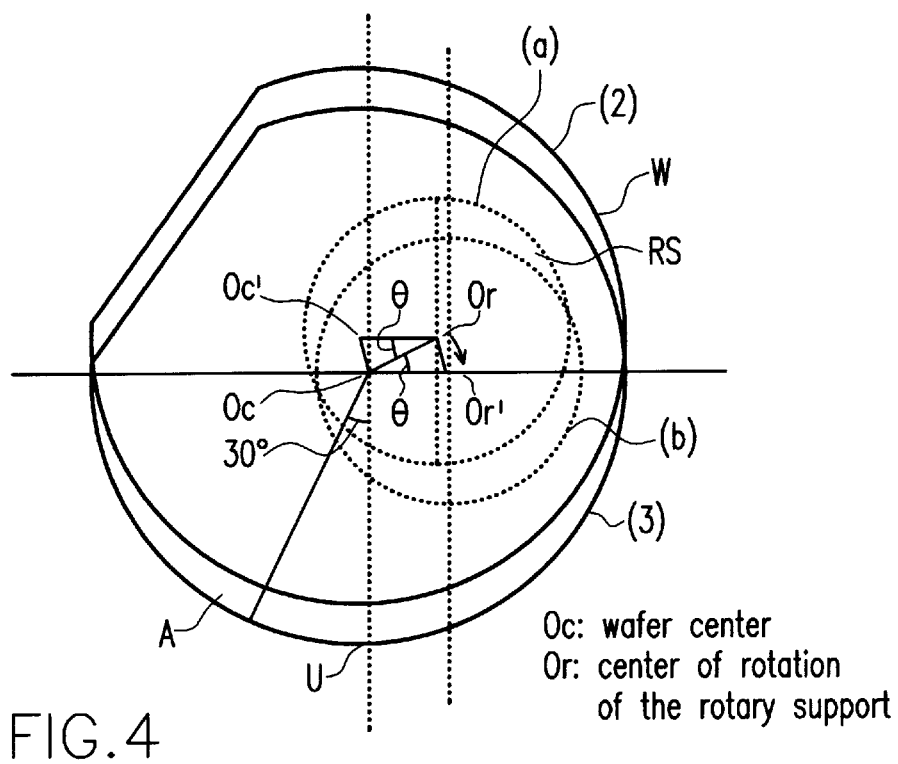
FIG. 4 shows a schematic of ring-shaped exposure of the peripheral area of the wafer (when the rotary support moves)

To satisfy the above described condition that the distance R between the wafer center Oc and the exposure light U remains constant, it is necessary to execute a drive control of the X-Y support XYS so as to move the rotary support RS on which wafer W is held and to bring the wafer center Oc' which has been shifted according to FIG. 3 into agreement with the position of the wafer center Oc when exposure starts, as is shown in FIG. 4. For this reason, the wafer W is moved from position (2) to position (3) (the rotary support RS is moved from position (a) to position (b)) and the center of rotation Or of the rotary support RS is moved to position Or'.

As is apparent from FIG. 4, the segment Oc'-Or and the segment Oc-Or' are parallel to one another. Both the angle between the segment Or'-Oc and the segment Oc-Or as well as the angle between the segment Or-Oc and the segment Oc'-Or are Θ. Or' is moved to a position which results from the center of rotation Or of the rotary support RS being turned and moved clockwise by e degrees around the wafer center Oc when exposure starts.

Consequently, the rotary support RS is moved and controlled by the X-Y support XYS such that, when exposure starts, the center of rotation Or of the rotary support RS is turned by Θ degrees around the wafer center Oc when the rotary support RS turns around the center of rotation Or by Θ degrees.

Specifically, the rotary support RS is driven in the manner described below:

(1) The coordinates of the wafer center Oc when exposure starts are defined as the origin (0, 0). Thus, a wafer coordinate system is defined, the X-direction of the X-Y support being designated the X-axis and the Y-direction of the X-Y support being designated the Y-axis.

(2) The coordinates of the center of rotation Or of the rotary support RS when exposure starts are fixed at (Xo, Yo).

(3) The X-Y support is moved and controlled at the same time in the X-direction and the Y-direction such that the coordinates (XΘ, YΘ) of the center of rotation Or of the rotary support RS in the wafer coordinate system, in the case of rotation of the rotary support RS around the center of rotation Or by Θ degrees, satisfy the following conditions (1) and (2):

$$X\Theta = Xo \cdot \cos\Theta + Yo \cdot \sin\Theta \quad (1)$$

$$Y\Theta = Yo \cdot \cos\Theta - Xo \cdot \sin\Theta \quad (2)$$

Figure 5:
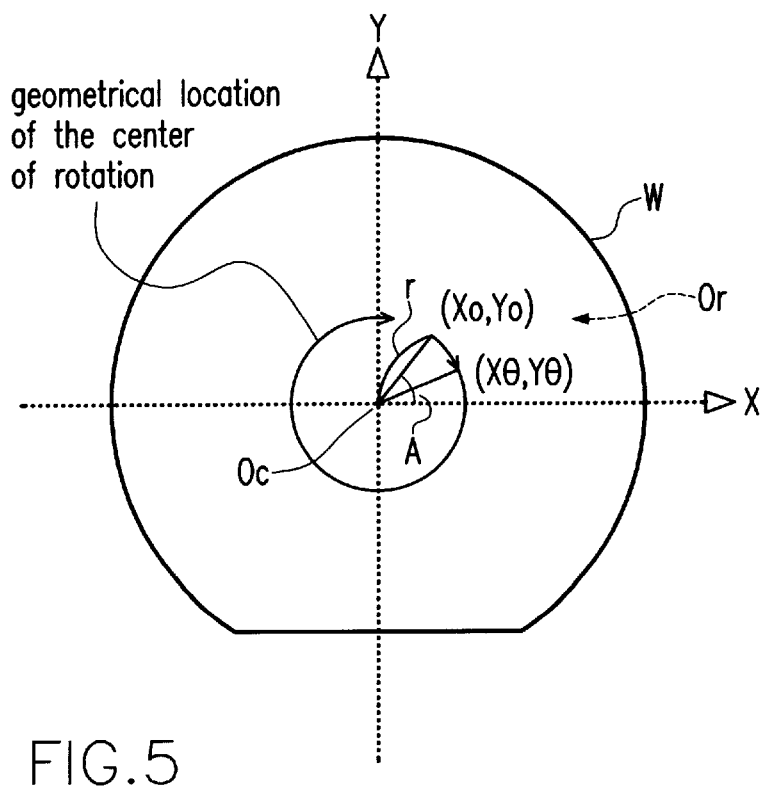
FIG. 5 shows a schematic of the computational basis of formulas (1) and (2)

This means that Xo and Yo are represented by the formulas described below, when the coordinates of the center of rotation Or are (Xo, Yo), for which in an X-Y coordinate system in which the wafer center Oc is at the origin (0, 0), the angle between a line which has a distance r from the wafer center Oc and which connects the center of rotation Or to the wafer center Oc, and the X-axis is at A, as is illustrated in FIG. 5, is:

Xo=r cos A
Yo=r sin A

When proceeding from this state, the coordinates of the center of rotation Or upon rotation clockwise by an angle Θ are (XΘ, YΘ), with XΘ and YΘ being represented by the following formulas:

$$X\Theta = r \cos(A-\Theta)$$

$$Y\Theta = r \sin(A-\Theta)$$

Here, with respect to XΘ and YΘ, the following is obtained:

$$X\Theta = r\cos(A - \Theta)$$
$$= r(\cos A \cdot \cos\Theta + \sin A \cdot \sin\Theta)$$
$$= r\cos A \cdot \cos\Theta + r\sin A \cdot \sin\Theta$$

$$Y\Theta = r\sin(A - \Theta)$$
$$= r(\sin A \cdot \cos\Theta - \cos A \cdot \sin\Theta)$$
$$= r\sin A \cdot \cos\Theta - r\cos A \cdot \sin\Theta$$

As was described above, XΘ and YΘ are represented by formulas (1) and (2) because Xo=r cos A and Yo=r sin A.

The center of rotation Or of the rotary support RS is turned once by the above described control on a circle C with radius r in which the wafer center Oc forms the center of the circle, while the rotary support RS turns once.

In this way, using a device for stepped exposure of the peripheral area of the wafer, by means of the above described control, the peripheral area of the wafer W can be exposed in a ring shape without moving the exposure light irradiation part. Furthermore, ring-shaped exposure of the peripheral area of the wafer can be done without bringing the wafer center and the center of the rotary support into agreement. Therefore the need for an arrangement of a centering device for this purpose and a centering process can be eliminated and actuation of the device can be simplified.

Figure 6A:
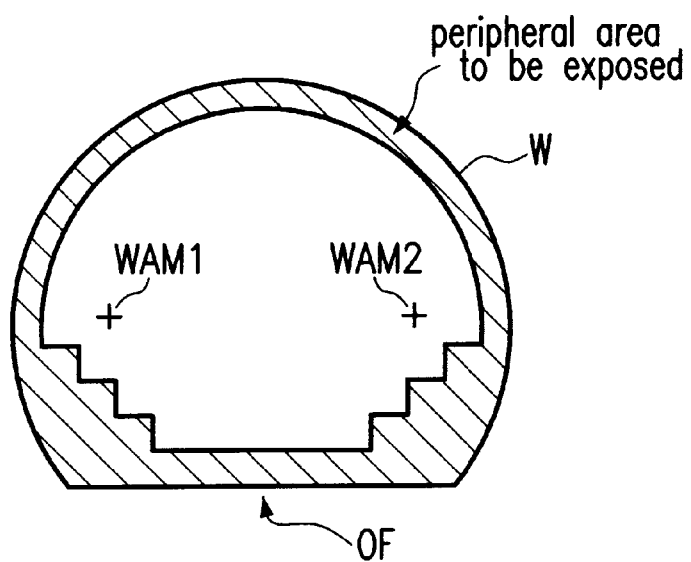
FIGS. 6(a) and (b) each show a schematic of the area to be exposed and the alignment marks of the wafer.
Figure 6B:
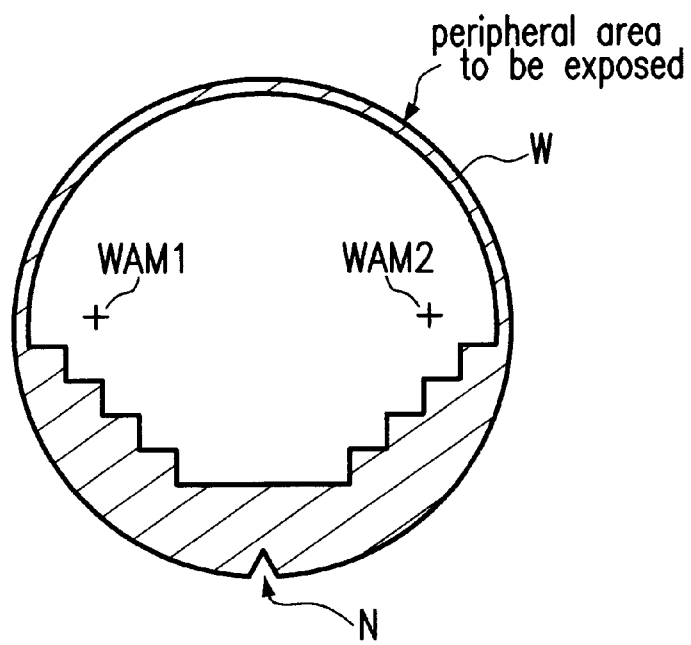

FIGS. 6(a) and (b) each schematically show an area of wafer W to be exposed as well as alignment marks, the wafer W having an orientation flat OF which shows the crystal direction of the wafer W and which hereinafter is called "Ori-Fla" (FIG. 6(a)). In the alternative, the crystal orientation is mark by a peripheral "notch" N (FIG. 6(b)).

A circuit pattern is formed such that it proceeds from the Ori-Fla OF or from the notch N. In stepped exposure of the peripheral area of the wafer W, therefore, rough positioning is produced using the Ori-Fla OF or notch N, afterwards exact positioning is produced using the alignment marks WAM1 and WAM2 recorded on the wafer W, afterwhich exposure is produced.

In FIG. 1, a rotary drive device M is shown which turns the rotary support RS and which is located on the X-Y support XYS which moves in the X-Y directions (X: for example, to the right and left in FIG. 1; Y: for example, to the front and back in FIG. 1).

When the X-Y support XYS is driven by means of the X-Y support drive device SD, the rotary support RS moves together with the rotary drive device M in the X-Y directions. The X-Y support and the X-Y support drive device SD can also be made integral with one another.

Furthermore, reference an exposure light source is comprised of a lamp which emits UV radiation, a focussing mirror, an integrator lens, a condenser lens, a filter, a shutter SH1 which is driven by means of a shutter drive device SC1, and the like. The exposure light emitted from the exposure light source LH1 is, if the shutter SH1 is open, routed via optical fibers LF1 to an exposure light exit part LO1. The exposure light emitted from the exposure light source LH1 exposes the peripheral area of the wafer W both in a step-shape and ring-shape, as described below.

Figure 7A:
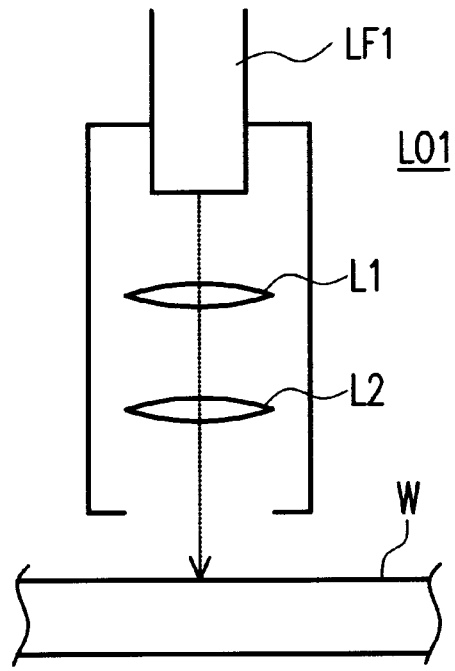
FIGS. 7(a) and (b) each show a schematic of one example of the arrangement of the exposure light exit part.

FIGS. 7(a) and (b) each schematically show one example of the arrangement of the exposure light exit part LO1. The exposure light exit part LO1 has a lens L1 and a lens L2, as is illustrated in FIG. 7 (a), focusses the light emitted by the optical fibers LF1 through lenses L1 and L2 and emits it onto the wafer W. The exposure light exit part can also have mirrors instead of lenses. The area irradiated by the exposure light exit part LO1 has a shape similar to the face of the optical fibers LF1.

Figure 7B:
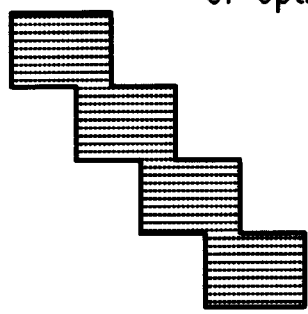

FIG. 7(b) shows the shape of the face of the optical fibers LF1 which supply exposure light to the exposure light exit part LO1. The optical fibers LF1, are, as shown in the drawing, located in a direction sloped by 45°. The area irradiated by the exposure light exit part LO1, therefore, also has the shape shown in FIG. 7(b).

Stepped exposure with a uniform amount of exposure can be produced by this shape of the area irradiated by the exposure light exit part LO1. At the same time, the area which can be treated by scanning can be widened and the irradiation time shortened (the details are described in the already filed Japanese application JP-OS HEI 8-102439).

In FIG. 1, an alignment unit AU is shown by which positioning of the area of the wafer W to be exposed is performed, as is described below.

Figure 8:
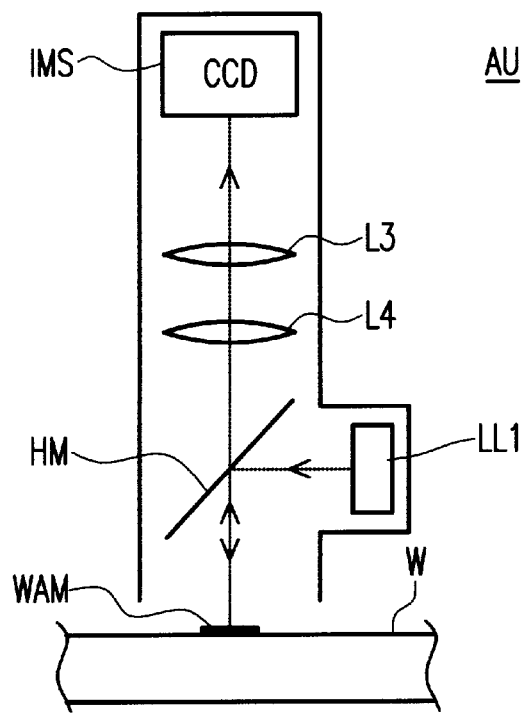
FIG. 8 shows a schematic of one example of the arrangement of the alignment unit.

FIG. 8 shows a schematic of one example of the arrangement of the alignment unit AU. The alignment unit AU consists of a nonexposure light irradiation device LL1 which emits nonexposure light, a half mirror HM, lenses L3 and L4, and an image recording element IMS such as a CCD camera or the like.

The nonexposure light emitted by the nonexposure light irradiation device LL1 is emitted via the half mirror HM onto the wafer W; its reflection light is received via the half mirror HM, the lens L4 and lens L3 by the image recording element IMS.

Figure 9:
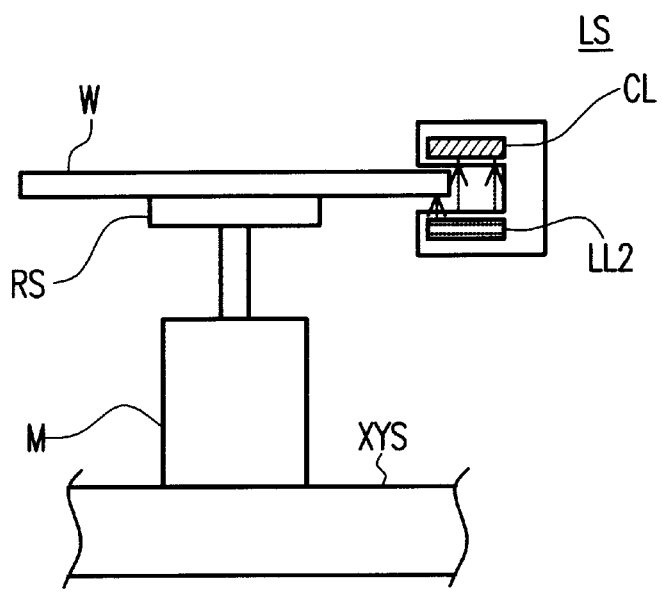
FIG. 9 shows a schematic of one example of the arrangement of a CCD line sensor.

In FIG. 1, a CCD line sensor LS is comprised of a light source LL2 which emits parallel nonexposure light, and a CCD array CL which receives the light emitted from the light source LL2, as is illustrated, for example, in FIG. 9. The light emitted by the light source LL2 is partially shielded by the peripheral edge of the wafer W. The light travelling on the outside of the peripheral edge is received by the CCD array CL. This means that the position of the peripheral edge of the wafer W can be determined depending on which pixel of the CCD array CL has received the light. For LS, not only a CCD line sensor, but any other device can be used if it can determine the peripheral edge of the wafer W based on the change in the amount of received light.

By observing the change of outputs of the CCD array as the wafer W turns, the position of the Ori-Fla OF (or the position of the notch N) of the wafer W and a measure of the deviation of the center of the wafer W from the center of rotation Or of the rotary support RS can be determined. To compute the amount of this deviation, for example, the process disclosed in Japanese patent disclosure document HEI 3-108315 (U.S. Pat. No. 5,168,021) can be used.

Figure 10:
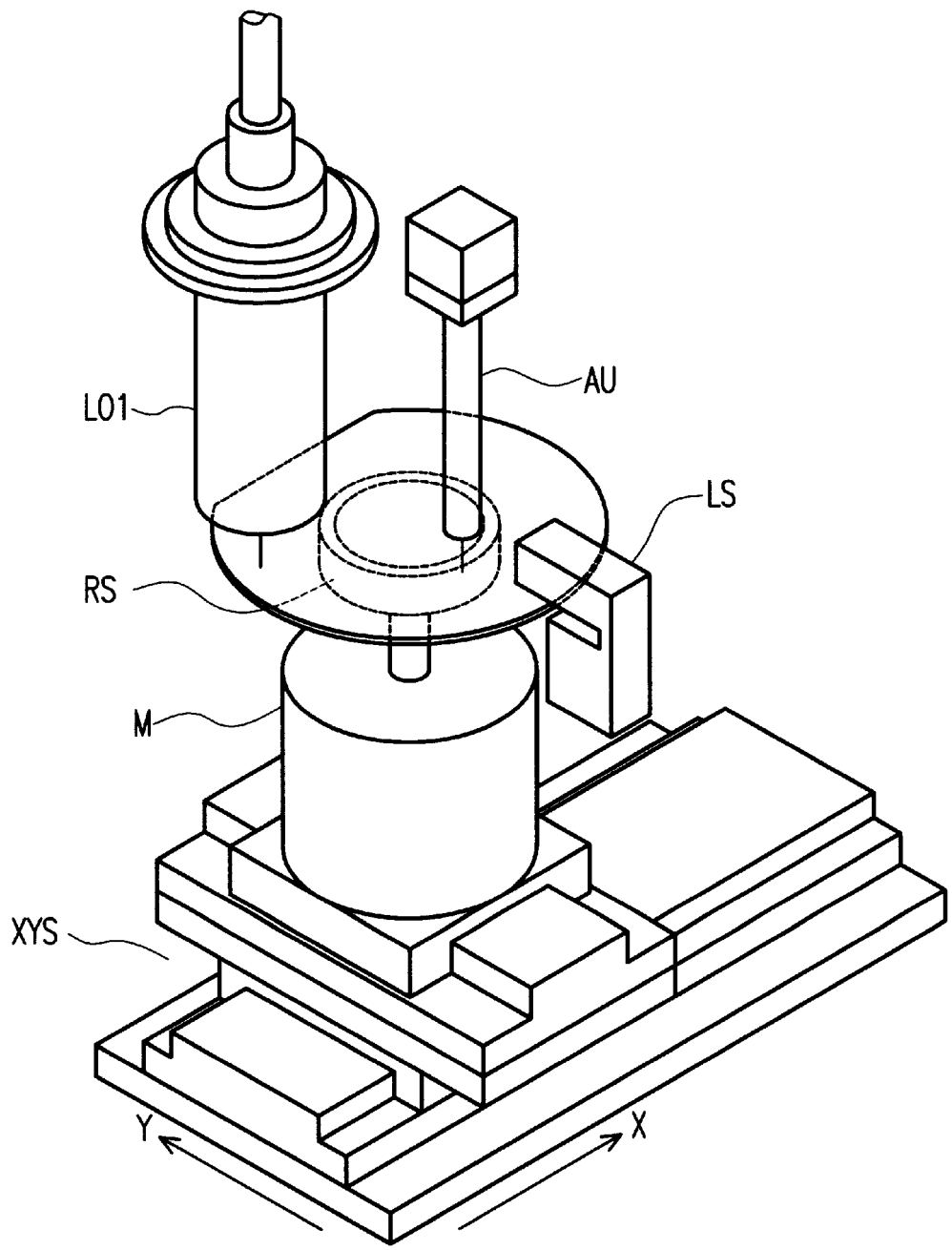
FIG. 10 shows a schematic of the specific arrangement of the device for exposing the peripheral area of a wafer.

FIG. 10 shows a schematic of the arrangement of the above described device for exposure of the peripheral area of a wafer. In the FIG. 10, the positional relationship is shown between the rotary support RS, the exposure light exit part LO1 and the like when the peripheral area of a wafer is exposed. In FIG. 10, the same parts as in FIG. 1 are provided with the same reference numbers.

In FIG. 10, an exposure light exit part LO1, an alignment unit AU and a CCD line sensor LS, are installed with variable position in a frame (not shown) arranged as shown in the drawings. Furthermore, a rotary support RS, a rotary drive device M which drives the rotary support RS, and X-Y support XYS on which the rotary drive device M is located and which moves in the direction of the arrows in the figure are shown.

For stepped exposure of the peripheral area of the wafer, the rotation of the rotary support RS is stopped and the peripheral area of the wafer is irradiated with the exposure light from the exposure light exit part LO1 by moving the wafer by means of the X-Y support XYS in the X-Y directions.

For ring-shaped exposure of the peripheral area of the wafer, the rotary support RS is turned by controlling the position of the X-Y support XYS so that the distance between the center of the wafer W and the exit part always remains constant, as was described above.

Figure 11:
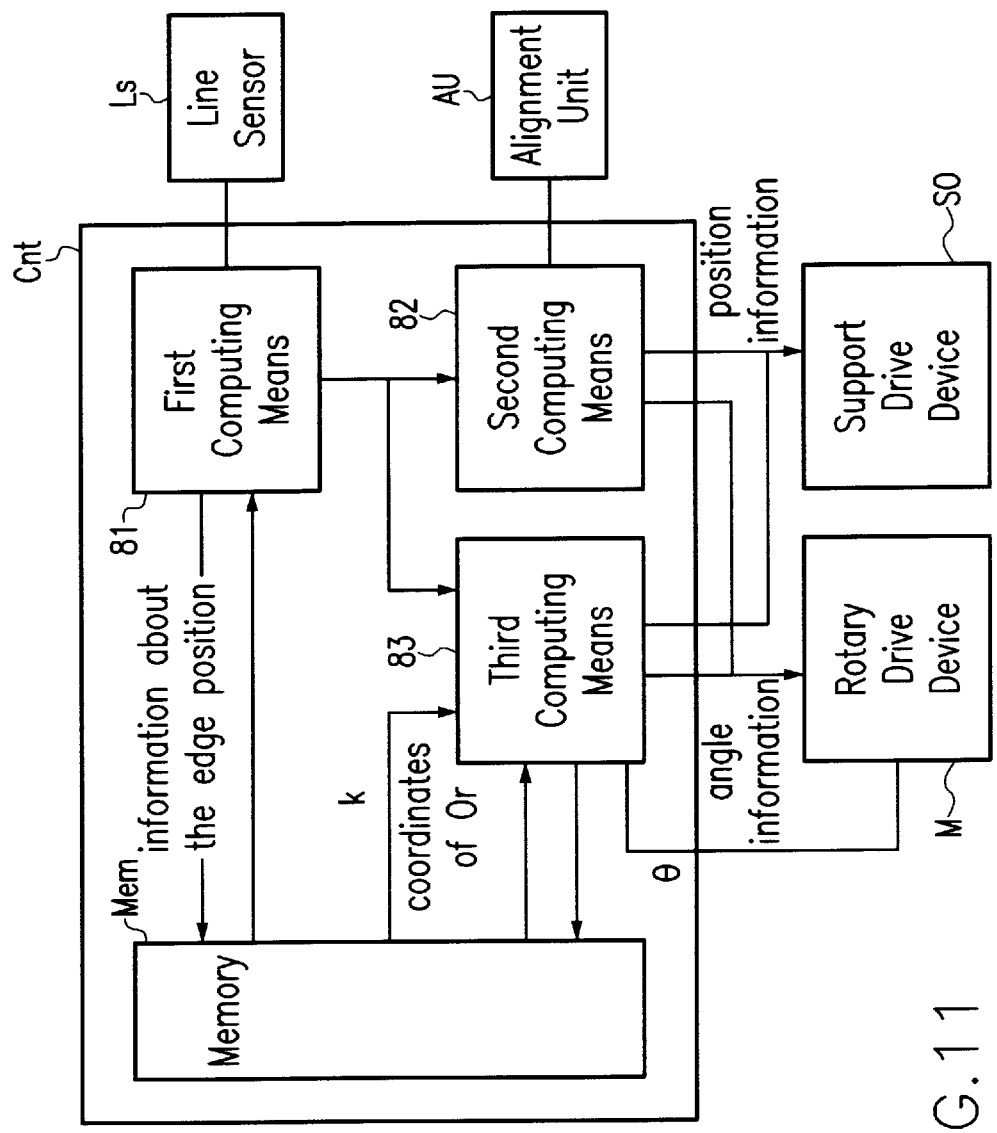
FIG. 11 shows a schematic of the arrangement of the control device.

FIG. 11 shows a schematic of the arrangements of a computing means in a control device Cnt which has a first computing means B1, a second computing means B2, a third computing means B3 and a memory Mem. In the memory Mem, the coordinate system perpendicular to the directions of movement of the X-Y support and the coordinates of the exposure light exit part LO1, the alignment unit AU and the CCD line sensor LS are set and stored beforehand.

The first computing means B1, based on the outputs of the CCD line sensor LS, computes the position of the peripheral edge of the wafer, the position of the singular point (Ori-Fla OF or notch N) which is formed in the peripheral area of the wafer, and the amount of deviation r of the position of the center of rotation Or of the rotary support RS from the position of the wafer center Oc.

The second computing means B2, based on the position coordinates of the alignment marks determined by the alignment unit AU, based on the amount of deviation r determined by the first computing means B1, based on the information about the position of the peripheral edge of the wafer and based on the position of the Ori-Fla (or the notch N), computes the position of the X-Y support XYS and the angle of rotation of the rotary support RS in stepped exposure of the peripheral area of the wafer W.

The third computing means B3, based on the predetermined exposure width k, proceeding from the peripheral edge of the wafer W, based on the amount of the deviation r determined by the first computing means, furthermore based on the information about the position of the peripheral edge of the wafer and about the position of the Ori-Fla OF (or the notch N), computes the position coordinates of the center of rotation Or of the rotary support RS when the peripheral area of the wafer is exposed in a ring shape.

The memory Mem stores information, determined by the CCD array CL, on the position of the peripheral edge, the amount of deviation r of the position of the wafer center Oc determined by the first computer means B1, the position of the singular point formed in the peripheral area of the wafer (Ori-Fla OF or notch N), the predetermined exposure width k, the position coordinates of the center of rotation Or of the rotary support RS or the like determined by the third computing means.

For stepped exposure of the peripheral area of the wafer, the control device Cnt, based on the outputs of the second computer means B2, controls the position of the X-Y support XYS and the angle of rotation of the rotary support RS to defined values, and the exposure light from the exposure light irradiation means is emitted onto the wafer.

For ring-shaped exposure of the peripheral area of the wafer, the position coordinates of the center of rotation Or of the rotary support RS determined by the third computing means B3 are stored in the memory Mem, the angle of rotation Θ of the rotary support RS which is output by a coder (not shown) located in the rotary support drive device M is read in, the position coordinates of the center of rotation Or of the rotary support RS which correspond to the angle of rotation O are read out by the memory Mem, the position of the X-Y support XYS and the angle of rotation of rotary support RS are controlled to predetermined values and the exposure light from the exposure light irradiation means is emitted onto the wafer.

In the following, exposure of the peripheral area of the wafer in this embodiment is described using FIGS. 12(a) to (e) which schematically show a respective stage in the operation of the device for exposure of the peripheral area of the wafer in this embodiment.

A. Step-shaped exposure of the peripheral area of the wafer

As was shown above in FIG. 14 (a), in stepped exposure of the peripheral area of the wafer rough positioning is done proceeding from the Ori-Fla OF or notch N, afterwards exact positioning is performed proceeding from the alignment marks WAM1 and WAM2 recorded on the wafer W, and exposure is produced. In the following, mainly exposure of the peripheral area of a wafer provided with Ori-Fla is described. However, the same process can be carried out in a wafer provided with a notch. Furthermore, in conjunction with the ring-shaped exposure of the peripheral area of the wafer described below, one part can be exposed in a step-shape and the other part in a ring-shape.

(1) Determination of the Peripheral Edge

Figure 12A:
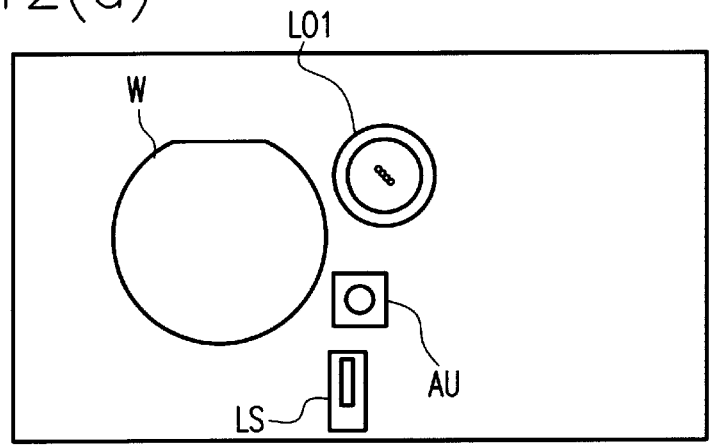
FIGS. 12(a) to (e) each show a schematic of a respective step in the operation of the device for exposing the peripheral area of a wafer in one embodiment of the invention.

The X-Y support XYS is driven by means of the X-Y support drive device SD and the rotary support RS is moved into the position shown in FIG. 12(a) and receives the wafer W transported by the wafer transport system WCV shown above in FIG. 1.

The wafer W is placed in a stipulated position of the rotary support RS and is attached by means of a vacuum chuck or the like. The position of the wafer W has minor deviations when the wafer W is transported. As a result of these deviations, the center Oc of the wafer W does not always agree with the center of rotation Or of the rotary support RS. In spite of these minor deviations, however, no centering is performed.

Figure 12B:
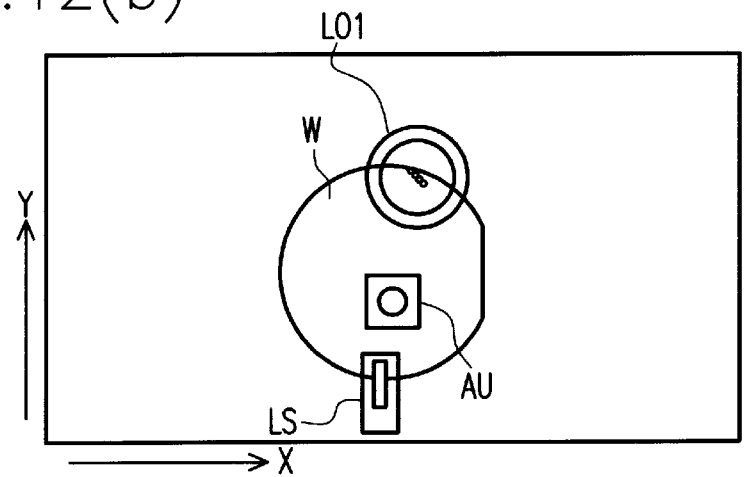

The X-Y support XYS is driven by means of the X-Y support drive device SD and the rotary support RS is moved into the position shown in FIG. 12(b) and turns the wafer W once around in a circle. During rotation of the wafer W, the position of the peripheral edge of the wafer W is determined by the CCD line sensor LS. The information on the peripheral edge position of the wafer W determined by the CCD line sensor LS is sent to the control device Cnt shown in FIG. 1, and is stored in the memory Mem located in the control device Cnt.

Based on information on the peripheral edge position of the wafer W stored in the memory Mem, the control device CNT determines the amount of the deviation r of the center Oc of the wafer W from the center of rotation Or of the rotary support RS, and furthermore, determines the position of the Ori-Fla OF (or notch N) of the wafer W and stores it. The above described amount of deviation r delivers information about the coordinates of the center Oc of the wafer W and information about the distance between the center Oc of the wafer W and the center of rotation Or of the rotary support RS.

(2) Movement Towards the Exposure Position

Based on the above described computed data, the drive of the rotary drive device M turns the rotary support RS until the Ori-Fla OF is parallel to the X-axis of the X-Y coordinate system shown in FIG. 12.

If the wafer W is provided with a notch, the rotary support RS is turned until the line which forms between the notch N and the center of the wafer W is parallel to the Y-axis.

As was described above, in the exposure of the peripheral area of the wafer W, the positioning of the area to be exposed is performed in two steps. This means that, first of all, positioning is done proceeding from the Ori-Fla OF or notch N and next, positioning is performed based on the alignment marks.

The reason for this is the following:

The circuit pattern is made in a predetermined position with reference to the Ori-Fla OF or the notch N. Since errors can occur depending on the accuracy in the pattern formation process which takes place before the process of exposure of the peripheral area of the wafer, with respect to the positional relationship between the location at which the pattern is formed and the Ori-Fla OF or notch F, it is a good idea to position the area to be exposed proceeding from the alignment marks in order to achieve stepped exposure with high precision.

Figure 12C:
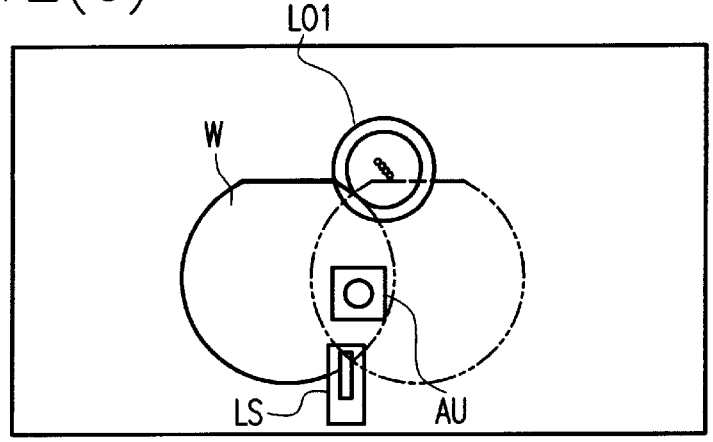

The control device Cnt, based on the above described amount of deviation r and based on the information stored beforehand in the control device Cnt on the position of the alignment mark WAM1 on the wafer W (as already described in FIG. 6), determines the amount of motion of the rotary support RS, by means of the X-Y support drive device SD, moves the rotary support RS so that the alignment mark WAM1 recorded on the wafer W (as shown in FIG. 6) extends into the visual field of the alignment unit AU, as is shown in FIG. 12(c) using the solid line. Since the above described errors of the location at which the pattern is formed are not as large as the alignment mark is outside of this visual field, it can be assumed that correction of the angular direction with which the alignment mark WAM1 is to extend into the visual field of the alignment unit AU has already taken place.

Next, nonexposure light is emitted from the nonexposure light irradiation device LL1 (as shown in FIG. 8) of the alignment unit AU. The position coordinates of the alignment mark WAM1 are determined and stored by the image recording element IMS.

The control device Cnt moves the rotary support RS by means of the X-Y support drive device SD by an amount which corresponds to the distance between the alignment mark WAM1 and the alignment mark WAM2 in the X-direction so that the alignment mark WAM2 recorded on the wafer W extends into the visual field of the alignment unit AU, as is shown in FIG. 12(c) using the dot-dash line.

Then, nonexposure light is emitted from the nonexposure light irradiation device LL1 (as shown in FIG. 8) of the alignment unit AU. The position coordinates of the alignment mark WAM2 are determined and stored by means of the image recording element IMS.

Based on the position coordinates of the alignment marks WAM1 and WAM2 determined in the above described manner and based on the stored information on the position of the two alignment marks, the control device Cnt computes the amount of rotation and the amount of motion of the rotary support RS, turns the rotary support RS such that the alignment marks WAM1 and WAM2 are positioned on the wafer W at predetermined points, drives the X-Y support XYS, and moves the rotary support RS.

The above described process is repeated until the difference between the actual positions of the alignment marks WAM1 and WAM2 on the wafer W and the preset positions thereof lie within a given value. If the difference is within this given value, the emission of nonexposure light from the nonexposure light irradiation device LL1 is stopped.

Since it is enough if the alignment marks WAM1 and WAM2 are located in a stipulated positional relationship to the pattern, two stipulated points in the periphery of the pattern which are defined, for example, by the intersection points of scribe lines (EP 0767409A) can also be used as alignment marks.

For the above described alignment, the method described in the already filed patent disclosure document HEI 9-162120 can be used. In this case, for example, the angle of inclination Θ between the line which passes through the above described alignment marks WAM1 and WAM2 and the X-axis direction is determined and the rotary support RS is turned and moved in such a way that the angle of inclination Θ lies within a preset range.

Figure 12D:
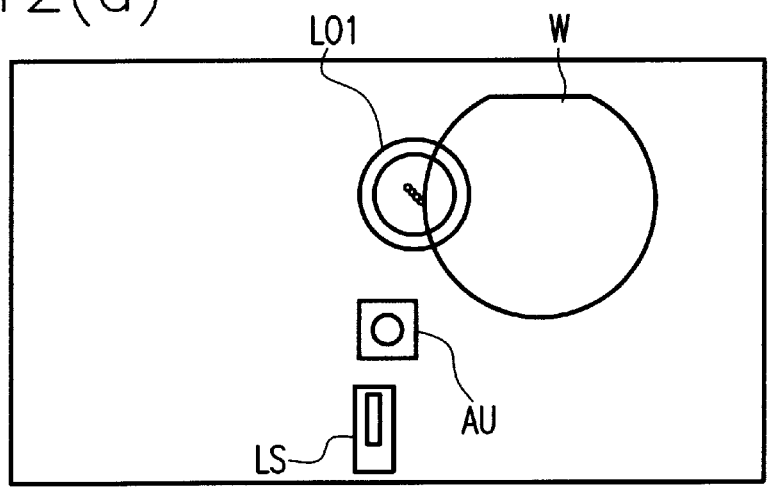

The control device Cnt, based on the above described amount of deviation r, computes the amount of motion of the rotary support RS and moves the rotary support RS such that the location of the wafer W at which stepped exposure is started is irradiated with the exit light from the exposure light exit part LO1, as is illustrated in FIG. 12(d).

(3) Exposure

The shutter SH1 of the exposure light source LH1 (as shown in FIG. 1) is opened. The exposure light from the exposure light exit part LO1 is emitted onto the peripheral area of the wafer W and thus stepped exposure is started.

Figure 13A:
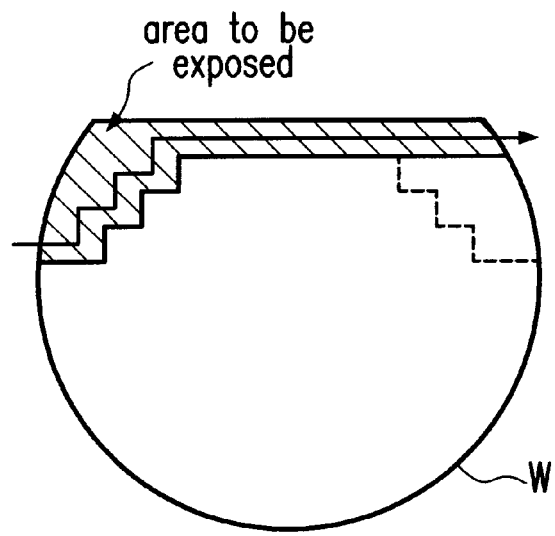
FIGS. 13(a) and (b) each show a schematic of one example of the exposure sequence in stepped exposure of the peripheral area of a wafer.
Figure 13B:
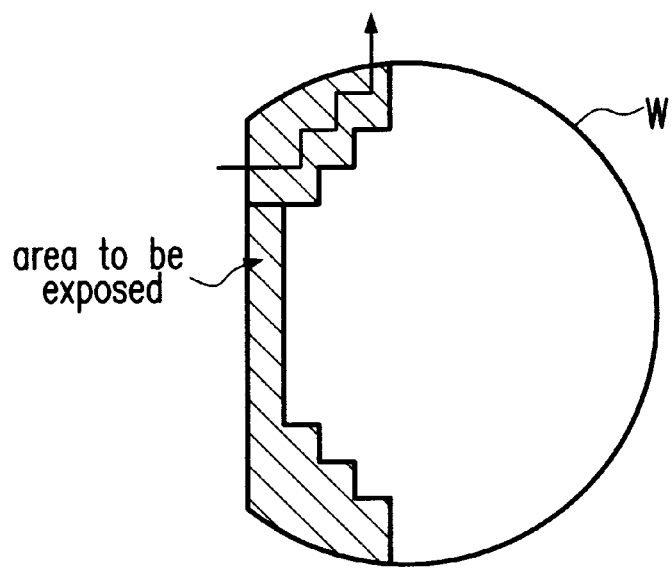

FIGS. 13(a) and (b) schematically show one example of the exposure sequence in stepped exposure of the peripheral area of the wafer W. In this case, the wafer W is moved by means of the X-Y support XYS in steps in the X-Y directions, first of all, the area shown in FIG. 13(a) being exposed. Next, the wafer W is turned by 90 degrees and the area shown in dotted lines FIG. 13(a) is likewise exposed so that the total area shown in FIG. 13(b) has now been exposed.

Figure 12E:
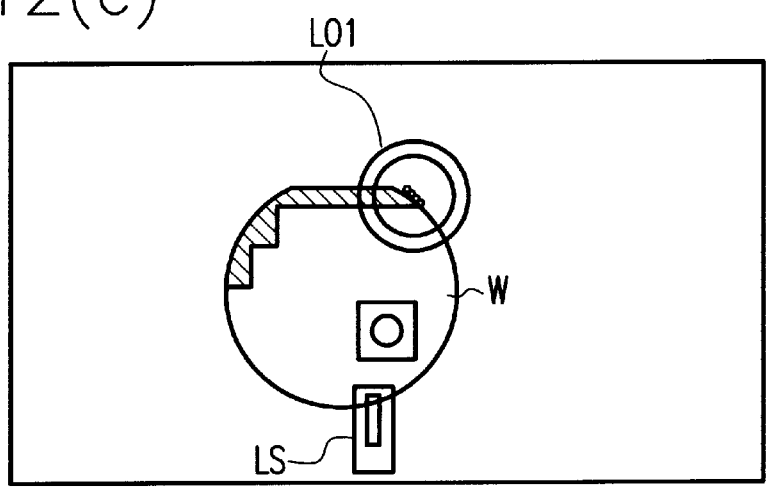

The control device Cnt moves the rotary support RS along the step-shaped exposure area stored beforehand as shown in FIGS. 13(a) and (b) in the X-Y directions. Thus, the peripheral area of the wafer W is exposed in a step-shape. FIG. 12(e) schematically shows the state in which the above described stepped exposure is performed. When the range of motion of the X-Y support XYS is wide, or when the area to be exposed in a step shape is narrow and exposure without rotation of the wafer W is possible, exposure need not necessarily be produced only after the wafer W has been turned in the above described manner by 90 degrees at a time.

B. Ring-shaped exposure of the peripheral area of the wafer

1. Ring-shaped Exposure of a Notched Wafer

In ring-shaped exposure of a notched wafer, the notch N is ignored, the wafer W is regarded as a disk, and exposure is performed with a constant width. Any exposure starting position can be assumed.

(1) Peripheral Edge Determination

As in A. (1) the rotary support RS is moved into the position shown in FIG. 12(a) and it receives the wafer W transported by the wafer transport system WCV shown in FIG. 1. The wafer W is placed in a predetermined position on the rotary support RS and is held in place by means of a vacuum chuck or the like. Even if the wafer center and the center of rotation of the rotary support deviate from one another, centering is not performed.

Next, the X-Y support drive device SD drives the X-Y support. The rotary support RS is moved into the position shown in FIG. 12(b), the wafer W is turned once in a circle, and the information determined by the CCD line sensor LS about the peripheral edge position of the wafer W is stored in the memory Mem located in the control device Cnt.

The control device Cnt, based on the information about the peripheral edge position of the wafer W stored in the memory Mem, determines the amount r of deviation of the center Oc of the wafer W from the center of rotation Or of the rotary support RS, and furthermore, determines the position of the notch N as a singular point and stores it.

The above described amount of deviation r delivers information about the coordinates of the center Oc of the wafer W and information about the distance between the center Oc of the wafer W and the center of rotation of the rotary support RS.

As was described above, in the control device Cnt, a coordinate system which is perpendicular to the direction of motion of the X-Y support XYS is defined, and furthermore, the exposure width k is set beforehand and stored for ring-shaped exposure of the wafer W.

(2) Motion of the Exposure Position

Based on the above described data, the X-Y support XYS is driven such that the peripheral area of the wafer W is positioned at a site at which the exposure light emerges from the exposure light exit part LO1. The wafer W seated on the rotary support RS is moved. This motion control is performed based on information about the location irradiated with exposure light and the exposure width k in the above described rectangular coordinate system (the coordinate system perpendicular to the direction of motion of the X-Y support XYS). The exposure width k in ring-shaped exposure of the wafer is changed by the wafer approaching the site from which the exposure light emerges or moves away from this site.

In the above described coordinate system, based on the computed amount of deviation r the wafer center Oc is defined as the origin of the coordinate system.

(3) Computation of the coordinates of the center of rotation Or of the rotary support RS In the wafer coordinate system in which the wafer center Oc is defined as the origin, based on the above described amount of deviation r, the coordinates (Xo, Yo) of the center of rotation Or of the rotary support RS are stored when exposure starts.

The coordinates (XΘ, Θ) of the center of rotation Or in the above described coordinate system, in the case of rotation of the rotary support RS around the center of rotation Or by Θ°, are computed using the following, already described formulas (1) and (2):

$$X\Theta = Xo \cdot \cos\Theta + Yo \cdot \sin\Theta \quad (1)$$

$$Y\Theta = Yo \cdot \cos\Theta - Xo \cdot \sin\Theta \quad (2)$$

The coordinates of the center of rotation Or of the rotary support RS which result from the computation carried out in the control device Cnt using the aforementioned formulas are stored in the memory Mem of the control device Cnt.

(4) Exposure

The exposure light (the exposure light U as shown in FIG. 2) is emitted from the exposure light exit part LO1 onto the wafer W. The rotary support RS is turned and exposure is started proceeding from the exposure starting position A (as shown in FIG. 2).

During exposure the angle of rotation Θ of the rotary support RS is determined by means of a coder (not shown) of the rotary drive device M. By moving the X-Y support XYS at the same time in the X-direction and Y-direction as far as the position of the stored data of the coordinates (XΘ, YΘ) of the center of rotation Or of the rotary support RS with reference to the above described angle Θ, the position of the center of rotation Or of the rotary support RS is subjected to motion control.

The rotation of the wafer W is not limited to a single revolution. The wafer can also be turned several times and the peripheral area of the wafer exposed several times.

2. Ring-shaped exposure of a wafer provided with Ori-Fla

In the case of ring-shaped exposure of the peripheral area of the wafer provided with Ori-Fla OF, as shown in FIG.

14(b), only the circular peripheral area of the wafer W is exposed in the manner described below. The straight region of the peripheral area of the wafer provided with Ori-Fla is exposed in the manner already described with respect to the stepped exposure by the X-Y support XYS being moved in a straight line proceeding from the alignment marks.

(1) Determination of the Peripheral Edge

As in A. (1), the wafer W is placed in a predetermined position on the rotary support RS and held in place by means of a vacuum chuck or the like.

Next, the X-Y support drive device SD drives the X-Y support XYS. The rotary support RS is moved into the position shown in FIG. 12(b) and turns the wafer W once in a circle. The information determined by the CCD line sensor LS about the peripheral edge position of the wafer W is stored in the memory Mem located in the control device Cnt.

The control device Cnt, based on the information about the peripheral edge position of the wafer W which was stored in the memory Mem, determines the amount of deviation r of the center Oc of the wafer W from the center of rotation Or of the rotary support RS, determines the position of the Ori-Fla OF as a singular point, and stores it.

The above described amount of deviation r delivers information about the coordinates of the center Oc of the wafer W and information about the distance between the center Oc of the wafer W and the center of rotation Or of the rotary support RS.

As was described above, in the control device Cnt, a coordinate system which is perpendicular to the direction of motion of the X-Y support XYS is defined, and furthermore, the exposure width k is set beforehand and stored for ring-shaped exposure of the wafer W.

(2) Motion of the Exposure Position

Based on the above computed data, the wafer W placed on the rotary support RS is moved to the site from which the exposure light emerges from the exposure light exit part LO1 and is turned at the same time. It is preferred that the above described exposure start position is identical to one of the two ends of the Ori-Fla OF.

This motion control is performed based on information about the site irradiated with exposure light and the exposure width k in the above described rectangular coordinate system (the vertical coordinate system which corresponds to the direction of motion of the X-Y support XYS) and based on information about the angle between the exposure starting position and the above described singular point (computation of the information about the angle with reference to the singular point is described, for example, in Japanese patent disclosure document HEI 2-114628, and corresponding U.S. Pat. No. 5,168,021).

In the above described coordinate system, based on the computed amount of deviation r, the wafer center Oc is defined as the origin of the coordinate system.

(3) Computation of the Coordinates of the Center Or of the Rotary Support RS

In the wafer coordinate system in which the wafer center Oc is defined as the origin, based on the above described amount of deviation r, the coordinates (Xo, Yo) of the center of rotation Or of the rotary support RS are stored when exposure starts.

The coordinates (X$\Theta$, Y$\Theta$) of the center of rotation Or in the above described coordinate system in the case of rotation of the rotary support RS around the center of rotation Or by $\Theta°$ are computed using the following, already described formulas (1) and (2):

$$X\Theta = Xo \cdot \cos\Theta + Yo \cdot \sin\Theta \quad (1)$$

$$Y\Theta = Yo \cdot \cos\Theta - Xo \cdot \sin\Theta \quad (2)$$

The coordinate data of the center of rotation Or of the rotary support RS which resulted by the computation carried out in the control device Cnt using the aforementioned formulas are stored in the memory Mem of the control device Cnt.

(4) Exposure

The exposure light U (as shown in FIG. 2) is emitted from the exposure light exit part LO1 onto the wafer W. The rotary support RS is turned and exposure is started proceeding from the exposure starting position A (one of the ends of the Ori-Fla).

During exposure, the angle of rotation $\Theta$ of the rotary support RS is determined by means of the coder (not shown) of the rotary drive device M. By moving the X-Y support XYS at the same time in the X-direction and Y-direction as far as the position of the stored data of the coordinates (X$\Theta$, Y$\Theta$) of the center of rotation Or of the rotary support RS with reference to the above described angle $\Theta$, the position of the center of rotation Or of the rotary support RS is subjected to motion control.

The rotary support RS is turned and moved until the location of the wafer W to be exposed last has been exposed. The frequency of the exposure of the peripheral area of the wafer W is not limited to one time. The peripheral area of the wafer can also be exposed several times.

The linear Ori-Fla area is then exposed in a straight line by the above described method of stepped exposure.

3. Partial exposure of a wafer W provided with Ori-Fla (or notch N) (removal of areas to be partially exposed; separate peripheral areas)

Figure 14A:
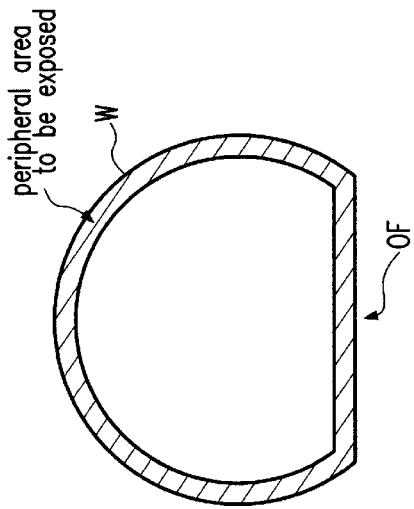
FIGS. 14(a) to (d) each show a schematic of the area of the peripheral area of a wafer to be exposed.
Figure 14B:
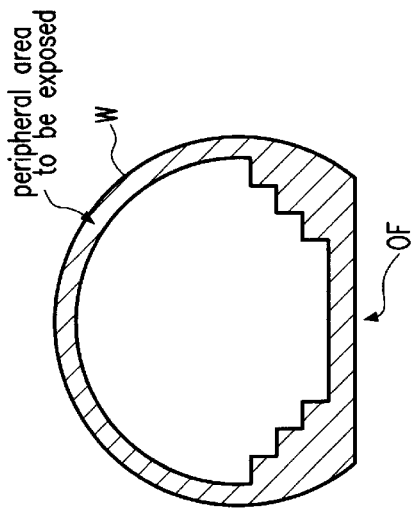
Figure 14C:
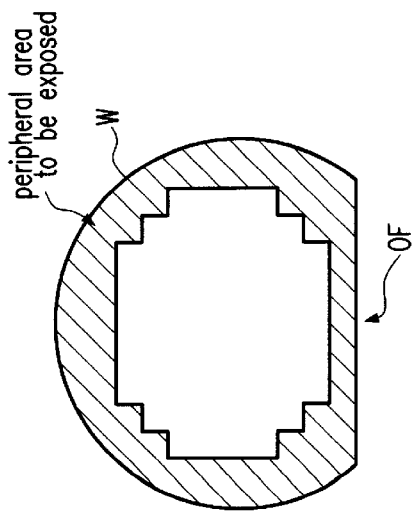
Figure 14D:
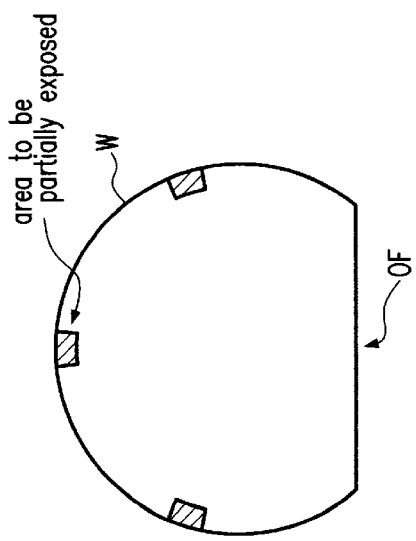

In the case of ring-shaped exposure of part of the peripheral area of a wafer W provided with Ori-Fla OF (or notch N) as shown in FIG. 14(c), the procedure is as follows:

(1) Peripheral Edge Determination

As in A. (1). the wafer W is placed in a preset position on the rotary support RS and is held in place by means of a vacuum chuck or the like.

Next, the X-Y support drive device SD drives the X-Y support. The rotary support RS is moved into the position shown in FIG. 12(b), and turns the wafer W once in a circle. The information determined by the CCD line sensor LS about the peripheral edge position of the wafer W is stored in the memory Mem located in the control device Cnt.

Based on the information about the peripheral edge position of the wafer W which was stored in the memory Mem, the control device Cnt determines the amount of deviation r of the center Oc of the wafer W from the center of rotation Or of the rotary support RS, determines the position of Ori-Fla OF or of the notch N as a singular point, and stores it.

The above described amount of deviation r delivers information about the coordinates of the center Oc of the wafer W and information about the distance between the center Oc of the wafer W and the center of rotation Or of the rotary support RS.

As was described above, in the control device Cnt, a coordinate system which is perpendicular to the direction of motion of the X-Y support XYS is defined and furthermore the exposure width k for ring-shaped exposure of the wafer W and information on the angle of the area to be partially exposed proceeding from the singular point (Ori-Fla OF or notch N) are set beforehand and stored.

(2) Motion of the Exposure Position

Based on the above described data, the X-Y support XYS is driven such that the location at which partial exposure of the peripheral area of the wafer W is started is positioned at a site from which the exposure light emerges from the exposure light exit part LO1. The wafer W seated on the rotary support RS is moved and turned at the same time. It is preferred that the above described starting position for partial exposure is identical to the information about the angle of the two set ends of the area to be partially exposed.

This motion control is performed based on information about the location irradiated with exposure light and the exposure width k in the above described rectangular coordinate system (the perpendicular coordinate system corresponding to the direction of motion of the X-Y support XYS) and based on information about the angle between the exposure starting position and the above described singular point (computation of information about the angle with reference to the singular point is described for example in Japanese patent disclosure document HEI 2-114628, U.S. Pat. No. 5,168,021).

In the above described coordinate system, based on the computed amount of deviation r the wafer center Oc is defined as the origin of the coordinate system.

(3) Computation of the Coordinates of the Center Or of the Rotary Support RS

In the wafer coordinate system in which the wafer center Oc is defined as the origin, based on the above described amount of deviation r, the coordinates (Xo, Yo) of the center of rotation Or of the rotary support RS are stored when exposure starts.

The coordinates (XΘ, YΘ) of the center of rotation Or in the above described coordinate system in the case of rotation of the rotary support RS around the center of rotation Or by $\Theta°$ are computed using the following, already described formulas (1) and (2):

$$X\Theta = Xo \cdot \cos\Theta + Yo \cdot \sin\Theta \quad (1)$$

$$Y\Theta = Yo \cdot \cos\Theta - Xo \cdot \sin\Theta \quad (2)$$

The coordinates of the center of rotation Or of the rotary support RS which resulted by the computation carried out in the control device Cnt using the aforementioned formulas are stored in the memory Mem of the control device Cnt.

(4) Exposure

The exposure light (the exposure light U as shown in FIG. 2) is emitted from the exposure light exit part LO1 onto the wafer W. The rotary support RS is turned and exposure is started proceeding from the starting position for partial exposure (one of the two ends of the region to be partially exposed).

During exposure, the angle of rotation Θ of the rotary support RS is determined by means of the coder (not shown in the drawing) of the rotary drive device M. By moving the X-Y support XYS at the same time in the X-direction and Y-direction as far as the position of the stored data of the coordinates (XΘ, YΘ) of the center of rotation Or of the rotary support RS with reference to the above described angle Θ, the position of the center of rotation Or of the rotary support RS is subjected to motion control.

The rotary support RS is turned and moved until the last location for partial exposure of the wafer W (the other end of the area to be partially exposed) has been exposed. The frequency of exposure of the area of the wafer W to be partially exposed is not limited to one time. Exposure can be done several times. In the case in which exposure is done several times, furthermore the wafer W can be turned and moved such that essentially proceeding from the center of the area to be partially exposed exposure is started and exposure is done towards the two ends and back from them. Furthermore, the exposure width of a certain zone can be partially changed and exposed by setting several exposure widths k beforehand.

The linear Ori-Fla area is then exposed in a straight line by the above described method of stepped exposure. C. Stepped exposure of part of the peripheral area of the wafer and ring-shaped exposure of the remainder As was shown above using FIG. 14(d), in stepped exposure of part of the peripheral area of the wafer and ring-shaped exposure of the remainder of the peripheral area of the wafer W, in the manner described above in A, exposure is first performed in a step-shape, while the peripheral area of the wafer W is exposed in a ring-shape in the manner described in B.

In this case, in stepped exposure or ring-shaped exposure, determination of the peripheral edge of the wafer W is performed. The position of the Ori-Fla OF, of the notch N or the like is determined as a singular point and together with the amount of deviation r of the center Oc of the wafer W from the center of rotation Or of the rotary support RS is stored in the control device Cnt. Therefore, in ring-shaped or stepped exposure, the above described data can be used unchanged.

In the above described embodiments, the coordinates of the center of rotation Or with reference to the angle of rotation Θ of the rotary support RS are computed beforehand and stored as coordinate data in the control device Cnt. During exposure the angle of rotation Θ of the rotary support RS is determined, the coordinates of the center of rotation Or of the rotary support RS are read out with respect to this angle and movement and control of the position of the center of rotation Or of the rotary support RS are done. However, the position coordinates of the center of rotation Or of the rotary support RS can also be computed in increments.

This means that, during exposure, the angle of rotation Θ of the rotary support RS is determined by the coder of the rotary drive device M by turning the rotary support RS. The coordinates of the Or (XΘ, YΘ) are computed in steps and the X-Y support XYS is controlled in such a way that the center of rotation OR of the rotary support RS reaches these position coordinates. To carry out this process, a fast computer is needed.

Since, in practice, in the range of Θ=0 to 360° some coordinates (XΘ, YΘ) of the center of rotation Or of the rotary support RS are computed and the rotary support RS moved, in an exact sense, a purely ring-shaped exposure is not performed, but rather a polygonal exposure is produced. However, if the coordinates of the Or (XΘ), YΘ) are taken so accurately that the ring shape is approached in practice (if, for example, Θ=0.1° a resulting polygon with 3600 comers approaches a circle) so that there is no problem.

In the above described computation of the coordinates (XΘ, YΘ) of the center of rotation Or, the length of the computation has no adverse effect on the throughput if the computation is performed using the time in which the wafer W is moved to the exposure position.

Action of the Invention

As was described above, according to the invention, the following effects can be obtained.

(1) Two exposure devices are not necessary, specifically one device for stepped exposure of the peripheral area of a wafer and one device for ring-shaped exposure of the peripheral area. The peripheral area of the wafer can be exposed both in a step-shape and also ring-shape with a single device. Therefore, the area occupied by the device can be reduced, as can equipment costs.

(2) In the case of stepped exposure of one part of the peripheral area of the wafer and ring-shaped exposure of the other part thereof, the wafer need not be transported. Furthermore, the peripheral edge of the wafer need be determined only once. Therefore, throughput can be increased.

(3) Using a device for stepped exposure of the peripheral area of the wafer, the peripheral area of the wafer can be exposed in a ring shape without using a memory with a high capacity.

(4) The peripheral area of the wafer can be exposed in a ring shape without bringing the wafer center and the center of the rotary support into agreement with one another. Therefore, a centering device is unnecessary. The centering process is eliminated so that both the device and actuation can be simplified.

What we claim is:

1. Device for exposing a peripheral edge of a semiconductor wafer which has an edge portion which is provided with a singular orienting shape and the wafer having a photoresist and alignment marks on a surface thereof, said device comprising:

a rotary support on which a wafer is seated and which turns the wafer;

an X-Y support which moves the rotary support parallel to the surface of the wafer in two orthogonally intersecting directions;

an exposure light irradiation means for irradiating the wafer with exposure light, a means for determining the position of peripheral edge of the wafer on the turning rotary support and producing position outputs relating to the position of the peripheral edge of the wafer;

an alignment unit for determining the position of the alignment marks on the wafer and producing alignment outputs relating to the position coordinates of the alignment marks on the wafer;

a control means which, on the basis of said position outputs from the means for determining the position of the peripheral edge of the wafer and on said alignment outputs of the alignment unit, drives the X-Y support and turns the rotary support, said control means comprising:

a first computing means which based on the position outputs of the means for determining the position of the peripheral edge of the wafer determines the amount of deviation of the center of rotation of the rotary support from the wafer center, information about the position of the peripheral edge of the wafer and the position of the singular orienting shape formed at said edge portion of the wafer;

a second computing means which, based on the position coordinates of the alignment marks determined by the alignment unit, based on the amount of deviation determined by the first computing means, based on information about the position of the peripheral edge of the wafer, and based on the position of the singular orienting shape, computes the position of the X-Y support in stepped exposure of the peripheral area of the wafer and the angle of rotation of the rotary support; and a third computing means which, based on a predetermined exposure width proceeding from the edge of the wafer, based on the amount of deviation determined by the first computing means, based on information about the position of the peripheral edge of the wafer and based on the position of the singular orienting shape, computes position coordinates of the center of rotation of the rotary support which are needed to keep the distance between the wafer center and the exposure light always constant when the peripheral area of the wafer is exposed in a ring shape;

means for controlling the position of the rotary support and the angle of rotation based on outputs of the second computing means and the third computing means; and means for causing the peripheral area of the wafer to be exposed in at least one of a step-shape and a ring-shape by irradiation of the wafer with exposure light from the exposure light irradiation means.

2. Device for exposing the peripheral area of a wafer as claimed in claim 1, wherein the exposure light irradiation means is configured so as to irradiate an area which extends at an angle of 45° to orthogonally intersecting scanning directions which run perpendicular to an incidence direction of the exposure light; and wherein the irradiation means is configured such that it irradiates an area at least one end of which has a rectangular contour, one side of the rectangular contour running parallel to one of the scanning directions and another side running parallel to the other scanning direction.

3. Device as claimed in claim 1, wherein the third computing means determines the position coordinates ($X_o$, $Y_o$) of the center of rotation of the rotary support when exposure starts in a wafer coordinate system in which the wafer center represents the origin, when the peripheral area of the wafer is exposed in a ring shape based on a predetermined exposure width, proceeding from the peripheral edge of the wafer, based on the amount of deviation determined by the first computing means, based on information about the position of the peripheral edge of the wafer and about the position of the singular orienting shape; wherein coordinates ($X\Theta$, $Y\Theta$) of the center of the rotary support in this wafer coordinate system, in the case of rotation of wafer by $\Theta$ degrees, are computed using the following formulas, $$X\Theta = X_o \cdot \cos\Theta + Y_o \cdot \sin\Theta$$

$$Y\Theta = Y_o \cdot \cos\Theta - X_o \cdot \sin\Theta$$

wherein, based on the outputs of the second computing means, the position of the rotary support and the rotation angle of the rotary support are controlled to predetermined values; wherein the wafer is irradiated with exposure light from the exposure light irradiation means; wherein the peripheral area of the wafer is exposed in a step-shape; wherein, when the rotary support is turned by $\Theta°$, the X-Y support is driven and the center of the rotary support is moved to the coordinate positions which were computed by means of the third computing means; wherein the wafer is irradiated with the exposure light from the exposure light irradiation means; and wherein the peripheral area of the wafer is exposed in a ring shape.

* * * * *